(12) United States Patent
Takahashi et al.

(10) Patent No.: US 9,744,962 B2
(45) Date of Patent: Aug. 29, 2017

(54) HYBRID CONSTRUCTION MACHINE

(71) Applicant: Hitachi Construction Machinery Co., Ltd., Tokyo (JP)

(72) Inventors: Chiaki Takahashi, Tokyo (JP); Ken Takeuchi, Tsuchiura (JP); Shinya Imura, Tsuchiura (JP)

(73) Assignee: HITACHI CONSTRUCTION MACHINERY CO., LTD., Tokyo (JP)

( * ) Notice: Subject to any disclaimer, the term of this patent is extended or adjusted under 35 U.S.C. 154(b) by 0 days.

(21) Appl. No.: 14/990,822

(22) Filed: Jan. 8, 2016

(65) Prior Publication Data
US 2016/0257293 A1 Sep. 8, 2016

(30) Foreign Application Priority Data

Mar. 3, 2015 (JP) .................................. 2015-040997

(51) Int. Cl.
*B60W 20/10* (2016.01)
*E02F 9/20* (2006.01)
(Continued)

(52) U.S. Cl.
CPC .............. *B60W 20/10* (2013.01); *B60K 6/20* (2013.01); *B60K 25/00* (2013.01); *B60W 10/06* (2013.01); *B60W 10/08* (2013.01); *B60W 10/26* (2013.01); *E02F 3/32* (2013.01); *E02F 9/2075* (2013.01); *E02F 9/2091* (2013.01);
(Continued)

(58) Field of Classification Search
CPC ...... B60W 10/06; B60W 10/08; B60W 10/26; B60W 20/10; B60W 2510/246; B60W 2710/06; B60W 2710/08; B60K 6/20; B60K 25/00; E02F 3/32; E02F 9/2075; E02F 9/2091; G01R 31/3679; H02J 7/0091; B60Y 2200/41; B60Y 2200/92; B60Y 2300/182; B60Y 2306/05;
(Continued)

(56) References Cited

U.S. PATENT DOCUMENTS

2009/0321163 A1* 12/2009 Suzui ..................... B60K 6/365
180/65.265
2011/0270481 A1 11/2011 Koga et al.
(Continued)

FOREIGN PATENT DOCUMENTS

| JP | 4923116 B | 4/2012 |
| JP | 5036662 B | 9/2012 |
| KR | 10-2011-0102396 A | 9/2011 |

*Primary Examiner* — Aaron L Troost
(74) *Attorney, Agent, or Firm* — Mattingly & Malur, PC

(57) ABSTRACT

The hybrid construction machine includes an engine 11, an electric motor/generator 14, a hydraulic pump unit 17, an electricity storage device 16, an inverter 15, a temperature regulator (16D or 16E), and a hybrid control unit 22. The hybrid control unit 22 executes at least one of first control for controlling a warming-up battery temperature regulator 16D so that it increases a temperature of the electricity storage device 16, second control for controlling the inverter 15 so that it reduces the power output from the inverter 15, and third control for controlling a pump capacity control unit 21 so that it reduces the flow rate of a hydraulic fluid delivered from the hydraulic pump unit 17, according to a charge/discharge history of the electricity storage device 16.

12 Claims, 10 Drawing Sheets

(51) Int. Cl.
  *G01R 31/36*    (2006.01)
  *H02J 7/00*     (2006.01)
  *B60K 25/00*    (2006.01)
  *B60W 10/06*    (2006.01)
  *B60W 10/08*    (2006.01)
  *B60W 10/26*    (2006.01)
  *E02F 3/32*     (2006.01)
  *B60K 6/20*     (2007.10)

(52) U.S. Cl.
  CPC ........ G01R 31/3679 (2013.01); H02J 7/0091 (2013.01); *B60W 2510/246* (2013.01); *B60W 2710/06* (2013.01); *B60W 2710/08* (2013.01); *B60W 2710/244* (2013.01); *B60Y 2200/41* (2013.01); *B60Y 2200/92* (2013.01); *B60Y 2300/182* (2013.01); *B60Y 2306/05* (2013.01); *B60Y 2400/112* (2013.01); *B60Y 2400/20* (2013.01); *B60Y 2400/61* (2013.01); *B60Y 2400/81* (2013.01); *B60Y 2400/87* (2013.01); *Y10S 903/93* (2013.01)

(58) Field of Classification Search
  CPC .......... B60Y 2400/112; B60Y 2400/20; B60Y 2400/61; B60Y 2400/81; B60Y 2400/87; Y10S 903/93
  See application file for complete search history.

(56) References Cited

U.S. PATENT DOCUMENTS

| | | | |
|---|---|---|---|
| 2014/0091579 A1* | 4/2014 | Kitamura ............... | E02F 9/2091 290/40 R |
| 2016/0221465 A1* | 8/2016 | Kratzer .................... | B60L 3/12 |
| 2016/0236581 A1* | 8/2016 | Tashiro ................. | H02J 7/0029 |

* cited by examiner

HYBRID CONSTRUCTION MACHINE

TECHNICAL FIELD

The present invention relates to hybrid construction machines.

BACKGROUND ART

In recent years, automobiles of a hybrid type and of an electric type have been prevalent in terms of energy saving, with the hybridization of construction machines also being accelerated. Construction machines such as hydraulic excavators driven by a hydraulic system typically include a hydraulic pump enabling the machine to work at a maximum load, a hydraulic work implement driven by a hydraulic fluid delivered from the hydraulic pump, and an engine for driving the hydraulic pump, to meet all working requirements from light-duty to heavy-duty operations.

Heavy-duty operations, including the heavy-duty excavation involving the use of the construction machine's hydraulic work implement to excavate soil and load a truck with the soil, however, are just part of all necessary work assigned to the machine. Light-duty operations, such as leveling out the ground surface, will fail to fully utilize the performance of the engine. This forms one of the causative factors rendering it difficult to reduce fuel consumption in the hydraulic excavator. Hybrid construction machines, intended to compensate for this drawback, are known to assist part of engine power output with an electricity storage device and an electric motor combined to reduce fuel consumption. The electricity storage device mounted on such a hybrid construction machine uses a lithium ion battery, a capacitor (such as an electric double-layer capacitor or a lithium ion capacitor), or a nickel hydrogen battery, for example.

Electricity storage devices are known to commonly have a characteristic of having increases in internal resistance due to charge/discharge of current or time varying deterioration associated with storage of electrical energy (hereinafter, the internal resistance may be referred to simply as resistance). These increases in internal resistance usually irreversibly increase resistance (hereinafter, this resistance may be referred to as irreversibly increasing resistance). Some researches state, on the other hand, that only if the charge/discharge of a too large current for a particular capacity of the electricity storage device is continued, this causes reversible increases in resistance (hereinafter, this resistance may be referred to as reversibly increasing resistance), and these increases in resistance differ from usual ones. Accordingly, Patent Documents 1 and 2 disclose control schemes for detecting a reversible increase in resistance and controlling the progress of deterioration.

Patent Document 1 discloses the control scheme for detecting the reversible increase in resistance, based upon a ratio between discharge resistance of an electricity storage device and charge resistance thereof, and pausing the charge/discharge of the electricity storage device after the ratio between the discharge resistance and charge resistance of the electricity storage device has decreased to a previously set value or lower.

Patent Document 2 discloses the control scheme for detecting the reversible increase in resistance, based upon an electric current estimation error between an estimated current value and a measured current value, and upon a difference in a concentration of a battery electrolyte between the electrodes. The estimated current value is used after being estimated from a simplified modeling expression relating to electrochemical reactions within electrodes. The control scheme then limits an amount of the current, an amount of electric power, and a voltage, if a degree of the reversible increase has exceeded a previously set value.

PRIOR ART DOCUMENTS

Patent Documents

Patent Document 1: Japanese Patent No. 4923116
Patent Document 2: Japanese Patent No. 5036662

SUMMARY OF THE INVENTION

Problems to be Solved by the Invention

In the conventional control methods disclosed in Patent Documents 1 and 2, however, during the detection of the reversible increase in resistance, the electricity storage device is brought into a pause or limits energy output. For this reason, when the control method is applied to an operator-manipulated vehicle such as a hybrid construction machine, a significant decrease in the operability is feared since the pause or energy output limitation of the electricity storage device is involved irrespective of the operator's manipulation status.

An object of the present invention is to provide a hybrid construction machine adapted to prevent its operability from significantly decreasing, while at the same time reducing the occurrence of a reversible increase in resistance.

Means for Solving the Problem

An aspect of the present invention for achieving the above object includes: an engine; an electric motor/generator that assists the engine during output of its power during power running and generates electricity during regenerative braking; a hydraulic pump unit that is driven by the power of the engine and delivers a hydraulic fluid; an electricity storage device; an electric power converter configured so that during the power running, converts direct-current (DC) power, supplied from the electric motor/generator, into alternating-current (AC) power and supplies the AC power to the electricity storage device, and during the regenerative braking, converts the AC power, generated by the electric motor/generator, back into the DC power and supplies the AC power to the electricity storage device; a temperature regulator that regulates a temperature of the electricity storage device; and a control device that in accordance with a charge/discharge history of the electricity storage device, performs at least one of first control controlling the temperature regulator so that it increases the temperature of the electricity storage device, second control controlling the electric power converter so that it reduces the electric power output from the hydraulic pump, and third control controlling the hydraulic pump unit so that it reduces a flow rate of a hydraulic fluid delivered from the hydraulic pump unit.

Effects of the Invention

In the hybrid construction machine according to the present invention, a significant decrease in the operability can be prevented, while at the same time the occurrence of the reversible increase in resistance can be reduced. Problems other than those associated with existing hybrid construction machines, and constituent elements and advantageous effects of the present invention will be apparent by the following description of embodiments of the invention.

MODES FOR CARRYING OUT THE INVENTION

Hereunder, configurations and operation of hybrid construction machines according to first to third embodiments of the present invention will be described using the accompanying drawings, wherein the same reference symbols and numbers denote the same elements.

First Embodiment

Figure 1:
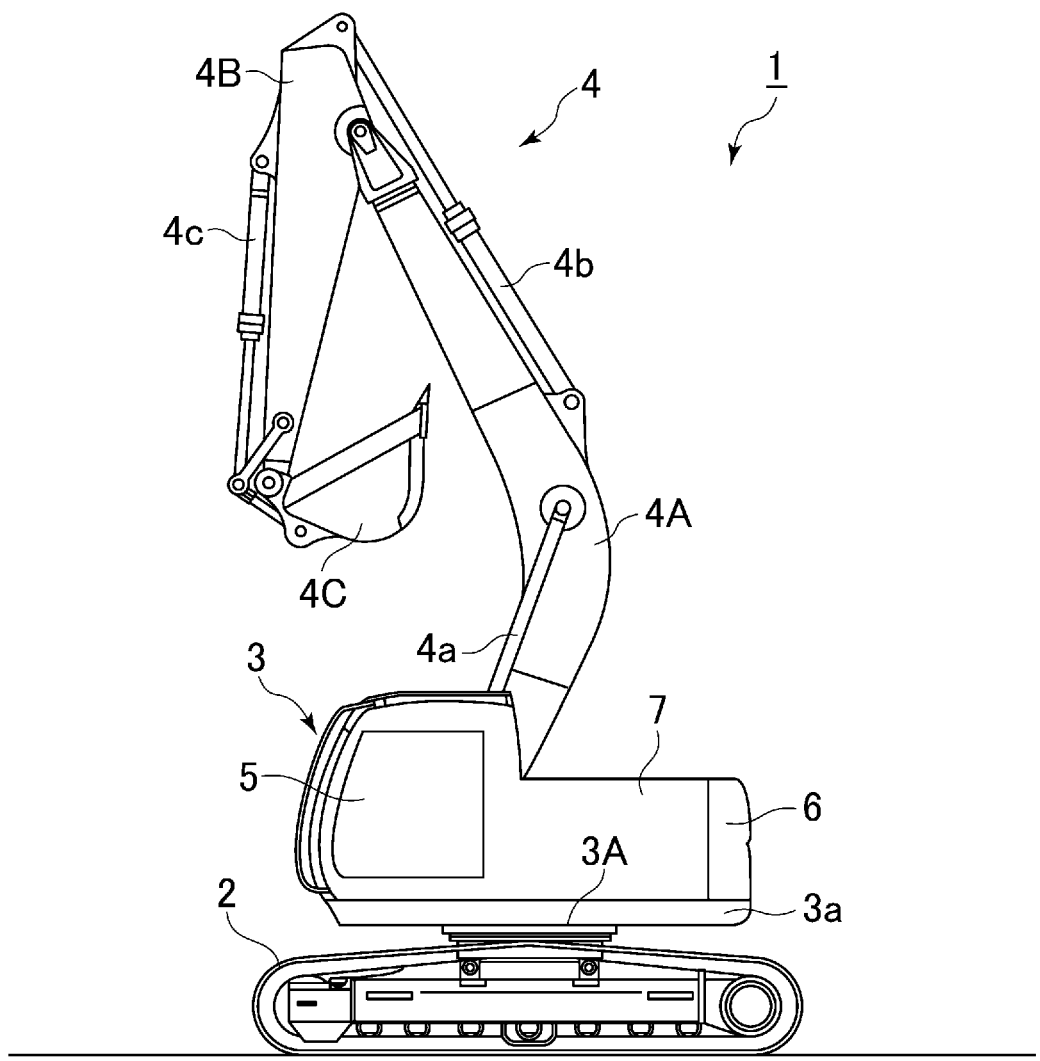
FIG. 1 is an external view of a hybrid excavator taken by way of example as a first embodiment of a construction machine according to the present invention.

First, the configuration of a hybrid construction machine will be described with reference to FIG. 1. FIG. 1 is an external view of a hybrid excavator taken by way of example as a first embodiment of a construction machine according to the present invention.

The first embodiment of the construction machine according to the present invention is applied to, for example, a hybrid hydraulic excavator shown in FIG. 1 (hereinafter, this machine will be conveniently termed the hybrid excavator). The hybrid excavator 1 includes: a track structure 2 driven by a hydraulic track motor 2A (see FIG. 2); a swing structure 3 swingably disposed above the track structure 2 via a swing frame 3a; a swing unit 3A, on which is mounted a hydraulic swing motor 3A1 (see FIG. 2) that is interposed between the track structure 2 and the swing structure 3 and that swings the swing structure 3 with respect to the track structure 2; and a front work implement 4, which is installed on one side of the anterior portion (right side of the machine as oriented forward) of the swing structure 3 and rotationally moves upward and downward to perform excavation and other work. The track structure 2, the swing structure 3, and the front work implement 4 function together as a hydraulic work implement.

The front work implement 4 includes an articulated structure equipped with: a boom 4A whose proximal end is pivotally mounted on the swing frame 3a and which rotationally moves upward and downward; an arm 4B pivotally mounted at a distal end of the boom 4A; and a bucket 4C pivotally mounted at a distal end of the arm 4B. The front work implement 4 also includes: a boom cylinder 4a that connects the swing structure 5 and the boom 4A together and extends or retracts to move the boom 4A so that it is rotatable; an arm cylinder 4b that connects the boom 4A and the arm 4B together and extends or retracts to move the arm 4A so that it is rotatable; and a bucket cylinder 4c that connects the arm 4B and the bucket 4C together and extends or retracts to move the bucket 4C so that it is rotatable.

The swing structure 3 includes a cabin 5 disposed on the other side of the anterior portion (left side of the machine when oriented forward) of the vehicle body, a counterweight 6 placed at rear of the vehicle body and maintaining a balance of a weight of the vehicle body, and a prime mover compartment 7 placed between the cabin 5 and the counterweight 6 and containing an engine 11 (see FIG. 2) that will be described later herein.

Figure 2:
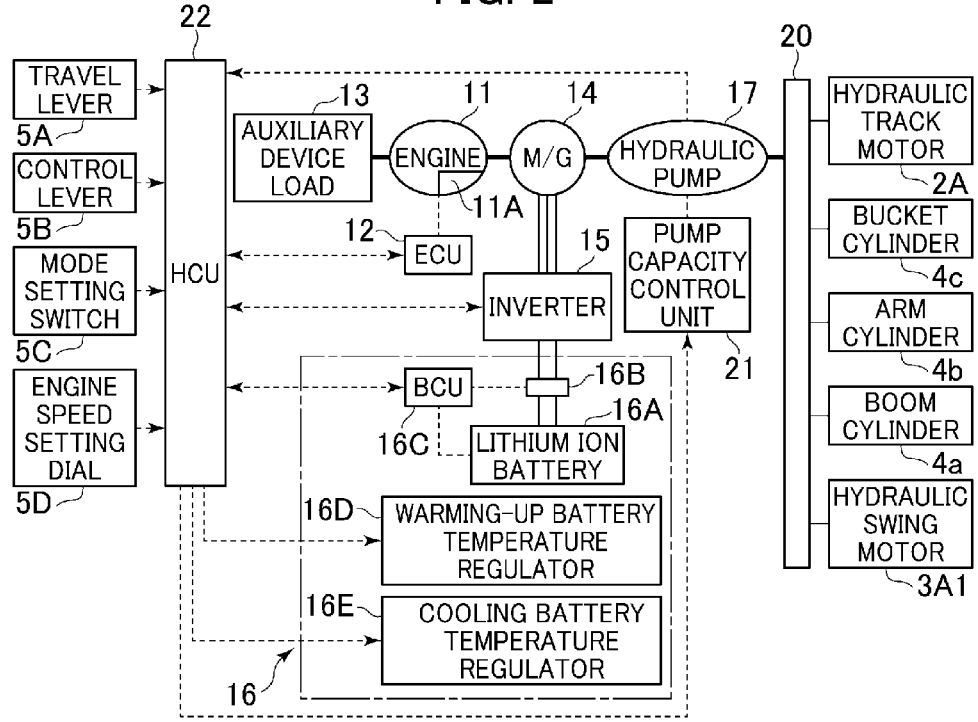
FIG. 2 is a functional block diagram showing an internal configuration of a swing structure employed in the first embodiment of the present invention.

FIG. 2 is a diagram that shows details of an internal configuration of the swing structure 3 including the cabin 5.

As shown in FIG. 2, the cabin 5 includes: a travel lever 5A and control lever 5b configured to enable desired operation of hydraulic actuators 2A, 3A1, and 4a to 4c, which are the hydraulic track motor 2A, the hydraulic swing motor 3A1, the boom cylinder 4a, the arm cylinder 4b, and the bucket cylinder 4c, the levers used by an operator inside the cabin 5 to operate the vehicle; a mode setting unit (mode setting switch) 5C that sets an operation mode of the vehicle body and changes a load required of the vehicle body; and a speed setting dial 5D that sets a target rotational speed of the engine 11 in the operation mode that has been set by the mode setting unit 5C. The mode setting unit 5C includes a mode setting switch that selects an operation mode, such as an economy mode (hereinafter referred to as the eco mode) for light-duty excavation, leveling, and other light-duty or middle-duty work, and a power mode for work higher in load than the work performed in the eco mode.

The swing structure 3 also includes the engine 11, a speed sensor 11A mounted on the engine 11 to detect the rotational speed of the engine 11, a fuel tank (not shown) for storage of a fuel for the engine 11, a governor (not shown) that controls a fuel injection rate of the engine 11, a supercharger of a turbocharger type (not shown) that is disposed near the engine 11, and an engine control unit (ECU) 12 that controls operation of the engine 11.

The swing structure 3 further includes: an auxiliary machine load 13, such as an air-conditioning system, that is connected to the engine 11 and operates by a drive force of the engine 11; an electric motor/generator (M/G) 14 that is disposed on a driveshaft of the engine 11 and transmits torque to the engine 11 to assist the power of the engine 11 and generate electricity; an inverter 15 that is connected to the electric motor/generator 14 and controls operation of the electric motor/generator 14; an electricity storage device 16 that exchanges electric power with the electric motor/generator 14 via the inverter 15; a variable-displacement hydraulic pump 17 (hereinafter, conveniently called the hydraulic pump) that is connected in series to the engine 11 and the electric motor/generator 14 and operates by the drive force of the engine 11 and that of the electric motor/generator 14 to deliver the hydraulic fluid; and a pilot pump (not shown) that operates by the drive force of the engine 11 to produce a hydraulic pilot fluid.

The electric motor/generator 14 is designed so that during power running, the electric motor/generator 14 assists the power of the engine 11 to drive the auxiliary machine load 13 and hydraulic pump 17 connected to the engine 11, and during regenerative braking, the electric motor/generator 14 generates electricity. The inverter 15, an electric power converter, is designed so that during power running, the inverter converts the DC power received from the electricity storage device 16 into AC power and supplies the AC power to the electric motor/generator 14, and during regenerative braking, the inverter converts the AC power that has been generated by the electric motor/generator 14, back into DC power and then supplies the DC power to the electricity storage device 16.

The electricity storage device 16 has, for example, a lithium ion battery 16A formed by a stack of battery cells, a current sensor 16B that is connected (placed) between the lithium ion battery 16A and the inverter 15 and measures a current of the lithium ion battery 16A, a battery control unit (BCU) 16C that is connected to the lithium ion battery 16A and the current sensor 16B and measures a voltage, temperature, current, and other parameters of the lithium ion battery 16A, a warming-up battery temperature regulator 16D that warms up the lithium ion battery 16A, and a cooling battery temperature regulator 16E that undertakes cooling.

The warming-up battery temperature regulator 16D and cooling battery temperature regulator 16E here work together to constitute a temperature regulator for regulating a temperature of the electricity storage device 16.

Examples of the warming-up battery temperature regulator 16D include a heater or a control valve for branching a flow of an engine coolant from an engine coolant pathway, for example. Examples of the cooling battery temperature regulator 16E include a fan or a coolant pump.

When the electrical energy stored within the lithium ion battery 16A is supplied to the inverter 15, this energy will be converted from DC to AC by the inverter 15 and then supplied to the electric motor/generator 14. By contrast, the electrical energy generated by the electric motor/generator 14 will be converted from AC back into DC and then supplied to the electricity storage device 16. Thus the electricity storage device 16 will be recharged.

The hydraulic pump 17 includes a swash plate (not shown) that operates as a variable-capacity mechanism, and when the swash plate has its tilt angle adjusted, the pump 17 will control a flow rate of the hydraulic fluid delivered. The hydraulic pump 17 further includes sensors (not shown). These sensors are a delivery pressure sensor for measuring a pressure of the delivered hydraulic fluid, a delivery flow sensor for measuring the flow rate of the delivered hydraulic fluid, and a tilt angle sensor for measuring a tilt angle of the swash plate in the hydraulic pump 17. Although a description is given herein of a case in which the hydraulic pump 17 is of a variable-capacity swash plate type, the hydraulic pump 17 is not limited to this type and may be, for example, any inclined-shaft pump having a function to control the flow rate of the delivered hydraulic fluid.

In addition, the swing structure 3 includes: a control valve 20 for controlling a flow of the hydraulic fluid supplied to the hydraulic actuators 2A, 3A1, and 4a to 4c; a pump capacity control unit 21 for controlling a capacity of the hydraulic pump 17; and a hybrid control unit (HCU) 22 connected to the travel lever 5A, the control lever 5B, the mode setting switch 5C, the speed setting dial 5D, the hydraulic pump 17, the engine control unit 12, the inverter 15, the battery control unit 16C, and the pump capacity control unit 21, and used to control total vehicle-body operation including the operation of the hydraulic pump 17 and inverter 15.

The hydraulic pump 17 and pump capacity control unit 21 here act together to constitute a hydraulic pump unit.

The control valve 20 forms a hydraulic circuit connecting to the hydraulic pump 17 and the hydraulic actuators 2A, 3A1, and 4a to 4c, and internal has a spool, which although not shown, controls the flow rate and direction of the hydraulic fluid delivered from the hydraulic pump 17, by moving through a stroke(s) inside a housing that forms an outer shell.

The pump capacity control unit 21 undertakes displacement capacity control of the hydraulic pump 17, based upon a control command output from the hybrid control unit 22. More specifically, the pump capacity control unit 21 includes, although not shown, a regulator that supports the swash plate of the hydraulic pump 17 so that it is tiltable, and a solenoid proportional valve that applies a control pressure to the regulator according to the control command from the hybrid control unit 22. Upon receiving the control pressure from the solenoid proportional valve, the regulator regulates the displacement capacity of the hydraulic pump 17 by changing the tilt angle of the swash plate in the hydraulic pump 17 according to the particular control pressure. The regulation makes the delivery pressure of the hydraulic pump 17 variable, and input torque control of the hydraulic pump 17 allows a load of the hydraulic pump 17 to be controlled as a pump output.

The hybrid control unit 22 receives input information denoting the delivery pressure measured by the delivery pressure sensor, the delivery flow rate measured by the delivery flow sensor, and the tilt angle measured by the tilt angle sensor, and computes the load of the hydraulic pump 17 from the input information. The travel lever 5A and the control lever 5B reduces a primary pressure that has been created from the hydraulic fluid delivered from the hydraulic pump 17, to a secondary pressure, thereby generates a control pilot pressure, and transmits the control pilot pressure as a hydraulic operating signal to the hybrid control unit 22. In accordance with the received hydraulic operating signal, the hybrid control unit 22 transmits a control command to the solenoid proportional valve of the pump capacity control unit 21, thereby controlling the power of the hydraulic pump 17.

The generated control pilot pressure, although not shown, is transmitted to a pressure receiving compartment of the control valve 20. This transmission changes a position of the spool in the control valve 20, thus causes the hydraulic fluid from the hydraulic pump 17 first and then the control valve 20 to be supplied to the hydraulic actuators 2A, 3A1, 4a to 4c, and drives the hydraulic actuators 2A, 3A1, 4a to 4c by the hydraulic fluid supplied from the hydraulic pump 17 via the control valve 20.

Figure 3:
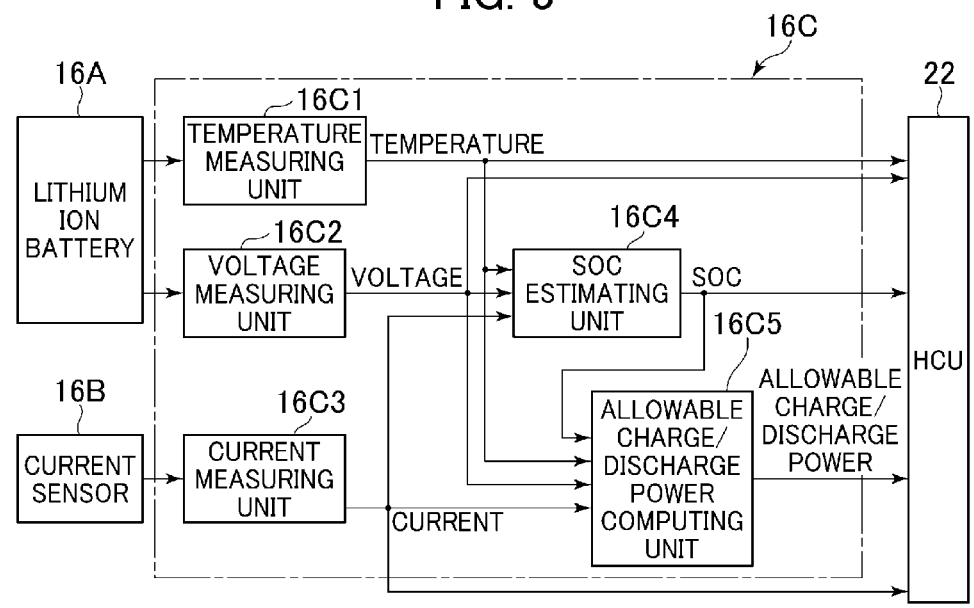
FIG. 3 is a functional block diagram showing a configuration of a battery control unit employed in the first embodiment of the present invention.

FIG. 3 is a functional block diagram showing a configuration of the battery control unit 16C.

The battery control unit 16C includes a temperature measuring unit 16C1 for measuring a temperature of the lithium ion battery 16A, a voltage measuring unit 16C2 for measuring a voltage of the lithium ion battery 16A, a current measuring unit 16C3 for A-D converting the value that has been measured by the current sensor 16B, and then receiving a value obtained by the conversion, and an SOC estimating unit 16C4 for estimating (calculating) a state of charge (SOC) of the electricity storage device 16, based upon three parameters. The three parameters are the temperature that has been measured by the temperature measuring unit 16C1, the voltage that has been measured by the voltage measuring unit 16C2, and the current value that has been input from the current measuring unit 16C3.

The battery control unit 16C also includes an allowable charge/discharge power computing unit 16C5 for computing an allowable charge/discharge power level that is maximum chargeable/dischargeable electric power of the lithium ion battery 16A, this computation being based upon the temperature measured by the temperature measuring unit 16C1, the voltage measured by the voltage measuring unit 16C2, the current value input from the current measuring unit 16C3, and SOC estimated by the SOC estimating unit 16C4. Information on the temperature measured by the temperature measuring unit 16C1, on the voltage measured by the voltage measuring unit 16C2, on the current value input from the current measuring unit 16C3, on the storage battery characteristics including the SOC estimated by the SOC estimating unit 16C4, and on the allowable charge/discharge power computed by the allowable charge/discharge power computing unit 16C5 is input to the hybrid control unit 22.

Next, the SOC estimation of the electricity storage device 16 by the SOC estimating unit 16C4 will be described in detail below.

For example, if the voltage, that is, an open circuit voltage, of the lithium ion battery 16A under a starting relay open state of the hybrid excavator 1 is expressed as SOC (0), a cumulative charge/discharge current value of the lithium ion battery 16A during operation of the hybrid excavator 1 is expressed as IS, and a full charge capacity of the lithium ion battery 16A is expressed as Cmax, then the following equation (1) will hold. The cumulative charge/discharge current value IS is a value obtained by integrating charge/discharge currents (charge current: positive, discharge current: negative) with respect to an elapse of time. The full charge capacity Cmax is prestored within, for example, an internal memory of the battery control unit 16C.

Equation 1

$$SOC = SOC(0) + \frac{IS}{C\max} \quad (1)$$

Although this is not shown, the SOC estimating unit 16C4 internally has an SOC—open circuit voltage table A denoting a relationship between the SOC and open circuit voltage of the electricity storage device 16. The SOC estimating unit 16C4 applies a starting open circuit voltage of the hybrid excavator 1 to the table A, thereby computing the obtained SOC as SOC (0). The SOC estimating unit 16C4 next assigns the computed SOC (0), the cumulative charge/discharge current value IS of the lithium ion battery 16A during the operation of the hybrid excavator 1, and the full charge capacity Cmax of the lithium ion battery 16A, to the above equation (1), thus calculating current SOC of the electricity storage device 16.

Next, the computation of the allowable charge/discharge power by the allowable charge/discharge power computing unit 16C5 will be described in detail below.

For example, if an allowable charge/discharge current is expressed as Ic, an upper limit value of the voltage of the lithium ion battery 16A as Vmax, the open circuit voltage as Vo, internal resistance as "r," and allowable charge power as Ec, then the following equations (2) and (3) will hold.

Equation 2

$$Ic = \frac{V\max - Vo}{r} \quad (2)$$

Equation 3

$$Ec = Ic \cdot (Vo + Ic \cdot r) \quad (3)$$

The allowable charge/discharge power computing unit 16C5 internally holds (in memory) the upper limit value Vmax of the voltage of the lithium ion battery 16A and a lower limit value Vmin thereof that will be described later herein. The allowable charge/discharge power computing unit 16C5 also internally holds a table B denoting a relationship between the SOC and open circuit voltage Vo of the electricity storage device 16. Furthermore, the allowable charge/discharge power computing unit 16C5 internally holds a table C denoting a relationship between the SOC of the electricity storage device 16, the temperature of the lithium ion battery 16A, and the internal resistance "r." The upper limit value Vmax and lower limit value Vmin of the voltage of the lithium ion battery 16A, the open circuit voltage Vo, and the internal resistance "r" constitute a value of a sum obtained by interconnecting the stack of battery cells in the lithium ion battery 16A. The table B here is the same as the table A. The two tables, A and B, are used for convenience sake in description of the present embodiment, but only one of them may be used in common.

The allowable charge/discharge power computing unit 16C5 computes the open circuit voltage Vo by applying the SOC estimated by the SOC estimating unit 16C4, to the table B. The allowable charge/discharge power computing unit 16C5 also computes the internal resistance "r" by applying the SOC estimated by the SOC estimating unit 16C4, and the temperature measured by the temperature measuring unit 16C1, to the table C.

The allowable charge/discharge power computing unit 16C5 further computes the allowable charge current Ic by assigning the upper limit value Vmax of the voltage of the lithium ion battery 16A, the computed open circuit voltage Vo, and the internal resistance "r," to the above equation (2). Furthermore, allowable charge/discharge power computing unit 16C5 computes the allowable charge power Ec by assigning the computed allowable charge current Ic, open circuit voltage Vo, and internal resistance "r" to the above equation (3).

At the same time, if the allowable discharge current is expressed as Id and the allowable discharge power as Ed, then the following equations (4) and (5) will hold.

Equation 4
$$Id = \frac{Vo - V\min}{r} \quad (4)$$

Equation 5
$$Ed = Id \cdot (Vo + Id \cdot r) \quad (5)$$

The allowable charge/discharge power computing unit 16C5 computes the allowable discharge current Id by assigning the lower limit value Vmin of the voltage of the lithium ion battery 16A, the open circuit voltage Vo computed in substantially the same manner as that of computing the allowable charge current Ic, and the internal resistance "r," to the above equation (4). The allowable charge/discharge power computing unit 16C5 also computes the allowable discharge power Ed by assigning the computed allowable discharge current Id, open circuit voltage Vo, and internal resistance "r" to the above equation (5). The computations by the allowable charge/discharge power computing unit 16C5 are performed to control the voltage of the lithium ion battery 16A to fall within a normal range, and thereby to prevent the lithium ion battery 16A from suffering thermal impacts due to internal short-circuiting or some other reason. The computations may however be performed for other purposes. For example, limits based upon the SOC of the lithium ion battery 16A, that is, a charge limit for SOC=threshold level Th1, and a discharge limit for SOC=threshold level Th2 (<Th1), both for the prevention of overcharge and overdischarge, and limits based upon the temperature of the lithium ion battery 16A for the prevention of overcharge and overtemperature may be provided separately.

Figure 4:
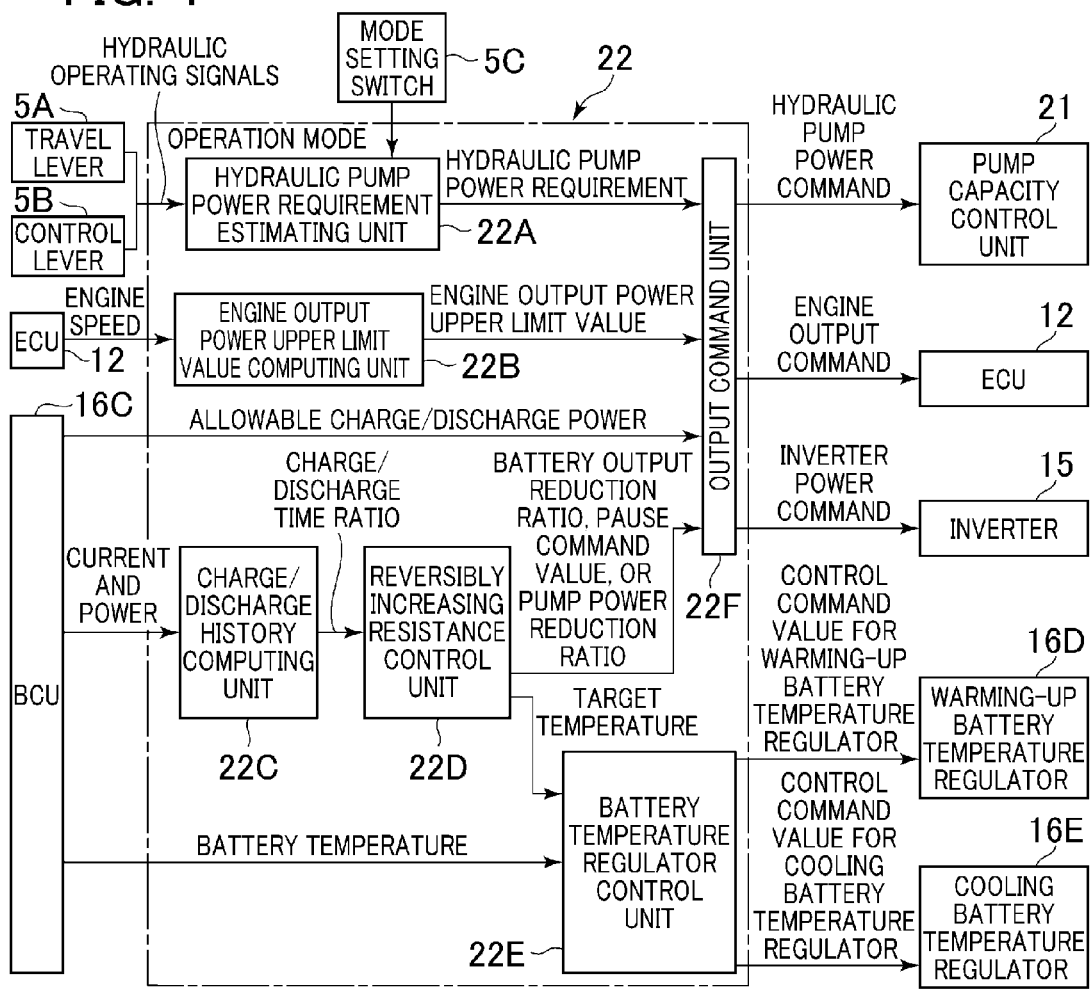
FIG. 4 is a functional block diagram showing a configuration of a hybrid control unit employed in the first embodiment of the present invention.

FIG. 4 is a functional block diagram showing a configuration of the hybrid control unit 22.

The hybrid control unit 22 includes: a hydraulic pump power requirement estimating unit 22A connected to the travel lever 5A, the control lever 5B, and the mode setting switch 5C, and configured to estimate the power required of the hydraulic pump 17 (hereinafter, this power will be conveniently referred to as the hydraulic pump power requirement); and an engine output upper limit computing unit 22B connected to the engine control unit 12 and configured to compute an upper limit value of output power of the engine 11 (hereinafter, the upper limit value will be conveniently referred to as the engine output upper-limit value).

The hybrid control unit 22 also includes a charge/discharge history computing unit 22C that computes a charge/discharge time ratio of the charge/discharge which has been performed within a certain period of time, based upon the current value or electric power value that has been received from the battery control unit 16C, and a reversibly increasing resistance control unit 22D that performs reversibly increasing resistance control based upon the charge/discharge time ratio. The certain period of time means a period from the present time to a time dating back for a predetermined period. The charge/discharge history is the charge/discharge current data that has been measured within the certain period of time for the electricity storage device, and the charge/discharge history includes the charge/discharge current value or the electric power value.

In addition, the hybrid control unit 22 includes a battery temperature regulator control unit 22E that computes control command values for the warming-up battery temperature regulator 16D and the cooling battery temperature regulator 16E, the control command values being based upon the battery temperature received from the battery control unit 16C, and upon a target temperature received from the reversibly increasing resistance control unit 22D.

The hybrid control unit 22 further includes an output command unit 22F. The output command unit 22F here is connected to the hydraulic pump power requirement estimating unit 22A, the engine output upper limit computing unit 22B, the reversibly increasing resistance control unit 22D, the battery control unit 16C, the pump capacity control unit 21, the engine control unit 12, and the inverter 15, and computes control command values to be output to the pump capacity control unit 21, the engine control unit 12, and the inverter 15.

Each constituent element of the hybrid control unit 22 will be described in detail below.

The hydraulic pump power requirement estimating unit 22A receives hydraulic operating signals from the travel lever 5A and the control lever 5B, and an operation mode signal from the mode setting switch 5C, and then in accordance with these input signals, estimates the outputs required of the hydraulic track motor 2A, the hydraulic swing motor 3A1, the boom cylinder 4a, the arm cylinder 4b, and the bucket cylinder 4c, that is, outputs required for the operation of the hydraulic actuators 2A, 3A1, and 4a to 4c.

Figure 5:
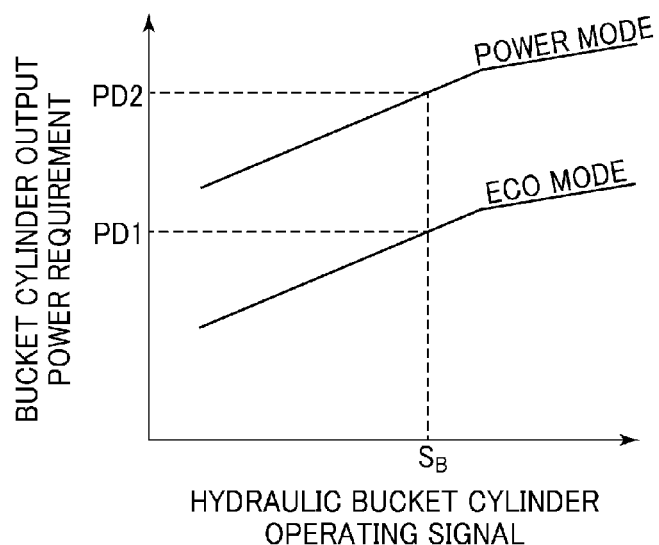
FIG. 5 is a hydraulic operating signal and output requirement characteristics curve that describes output power characteristics required of a bucket cylinder in the first embodiment of the present invention.

FIG. 5 is a diagram for describing output characteristics required of the bucket cylinder 4c, one of the hydraulic actuators 2A, 3A1, and 4a to 4c.

As shown in FIG. 5, the output required of the bucket cylinder 4c is set to increase as the hydraulic operating signal from the control lever 5B increases in value. The output required of the bucket cylinder 4c is also set to change according to an operation mode that the operator has set by the mode setting switch 5C.

For example, if the operator sets the eco mode as the operation mode of the vehicle body, since greater importance will be attached to fuel economy, the power required for the bucket cylinder 4c to output will be set to a lower level than usual, and when the hydraulic operating signal from the control lever 5B has a value of $S_B$, the power required for the bucket cylinder 4c to output will be PD1. If the operator sets the power mode as the operation mode of the vehicle body, since greater importance will be attached to operating speed, the power required for the bucket cylinder 4c to output will be set to a higher level than usual, and when the hydraulic operating signal from the control lever 5B has the value of $S_B$, the power required for the bucket cylinder 4c to output will be PD2 that is larger than PD1 (PD2>PD1). The hydraulic pump power requirement estimating unit 22A will therefore estimate the output power requirement of the bucket cylinder 4c from the value of the hydraulic operating signal from the control lever 5B in the operation mode which has been set by the mode setting switch 5C.

In substantially the same manner as with the bucket cylinder 4c, the hydraulic pump power requirement estimating unit 22A estimates the output power requirements of the other hydraulic actuators, which are the hydraulic track motor 2A, the hydraulic swing motor 3A1, the boom cylinder 4a, the arm cylinder 4b, from values of the hydraulic operating signals from the travel lever 5A and control lever 5B in the operation mode which was set by the mode setting switch 5C. The hydraulic pump power estimating unit 22A then outputs a total value of the output power requirements of the other hydraulic actuators, namely the hydraulic track motor 2A, the hydraulic swing motor 3A1, the boom cylinder 4a, the arm cylinder 4b, to the output command unit 22F, as the hydraulic pump power requirement.

Figure 6:
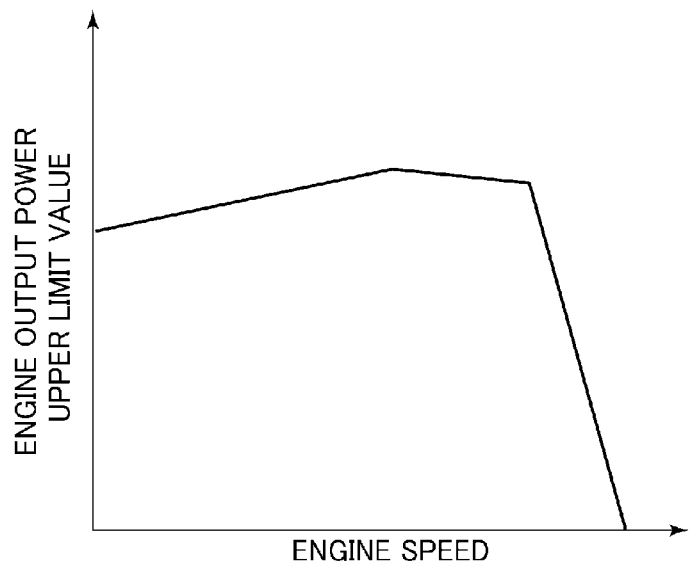
FIG. 6 is a speed and output upper limit value characteristics curve that describes output power characteristics of an engine in the first embodiment of the present invention.

FIG. 6 is a diagram representing a relationship between the speed of the engine 11 and the upper limit value of its output power.

An output power characteristics table D that has been set according to particular characteristics of the engine 11 is stored within a data storage device of the hybrid control unit 22. The output power characteristics table D indicates a relationship in which for example, when the speed of the engine 11 is low as shown in FIG. 6, the upper limit value of the engine output power increases with increases in the speed of the engine 11, and when the engine speed increases, the upper limit value of the engine output power decreases with the increases in engine speed. Since the upper limit value of the engine output power is defined by the engine speed, therefore, the upper limit value of the engine output power can be estimated from the engine speed.

In the first embodiment of the present invention, the engine output upper limit computing unit 22B receives via the engine control unit 12 the engine speed that the speed sensor 11A has detected, and computes the upper limit value of the engine output power from the engine speed and the output characteristics table D. The engine output upper limit value computing unit 22B next outputs the computed upper limit value of the engine output power to the output command unit 22F. The operator can change the engine speed by adjusting the target speed with the speed setting dial 5D.

Figure 7:
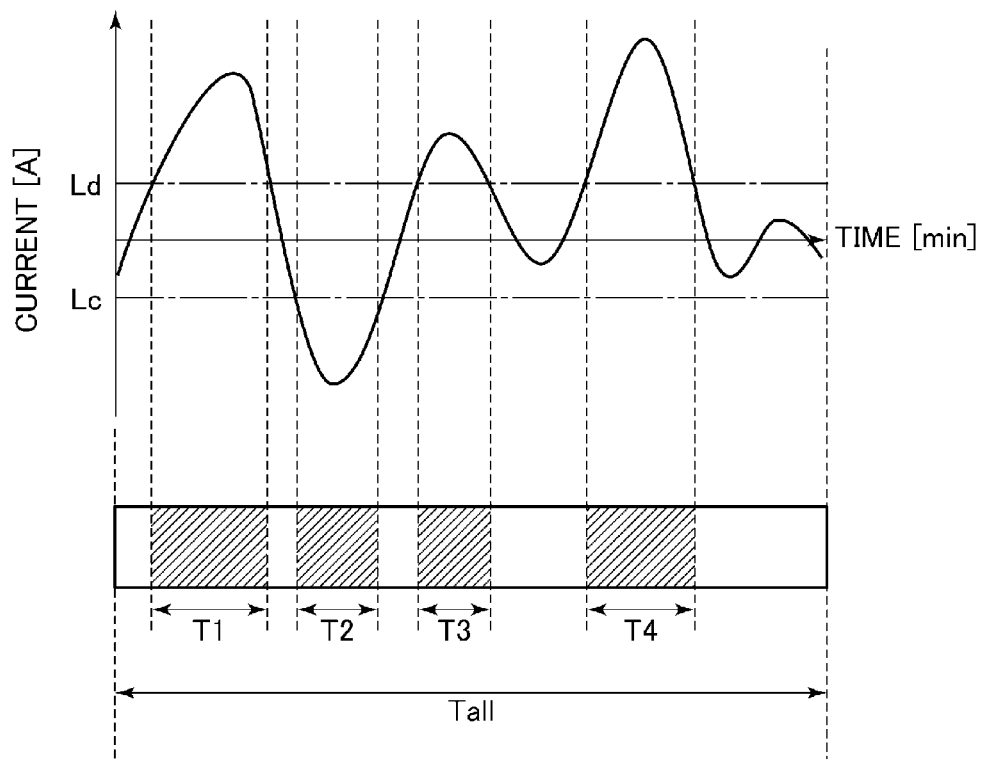
FIG. 7 is a diagram showing a charge/discharge time "Ti" and reference time "Tall" relating to an electricity storage device 16, "Ti" and "Tall" both being used to compute a charge/discharge time ratio in the first embodiment of the present invention.

On the basis of the electric current value or power value that the charge/discharge history computing unit 22C has received from the battery control unit 16C, the charge/discharge history computing unit 22C computes a time ratio of the charge/discharge which has been performed within the certain period of time (i.e., the charge/discharge time ratio). The computation of the charge/discharge time ratio will be hereinafter described. Electric power or an absolute value of current or electric power or a square value thereof may instead be used as a computing index of the charge/discharge time ratio. FIG. 7 is a diagram showing the charge/discharge time ratio Ti (i=1, 2, 3, . . . , n) and a reference time Tall. The computation of the charge/discharge time ratio will be detailed below with reference being made to FIG. 7, wherein "Ld" and "Lc," which are charge/discharge threshold levels of discharge and charge currents, respectively, may be provided to remove any effects of very weak currents causing no reversible increase in resistance, such as a consumption current (dark current) of the battery control unit 16C during idling. The time when the current value of the electricity storage device 16 equaled to or decreased below the discharge threshold level "Ld" or equaled to or increased above the charge threshold level "Lc" is defined as the charge/discharge time ratio Ti (i=1, 2, 3, . . . , n). The charge/discharge time ratio Rt is computed from following equation (6) using the charge/discharge time ratio Ti (i=1, 2, 3, . . . , n) and the reference time Tall. The reference time Tall in equation (6) denotes the certain period of time, which is, for example, a period of past 10 hours from the present time.

Equation 6

$$Rt = \frac{\Sigma Ti}{\text{Tall}} \ (i = 1, 2, 3, \ldots, n) \quad (6)$$

The reversible increase in resistance is caused here by a nonuniform distribution of lithium ions in the battery electrolyte. Accordingly the latest charge/discharge affects the reversible increase in resistance most significantly. For this reason, the charge/discharge time ratio Ti (i=1, 2, 3, . . . , n) may be weighted by multiplying it by a charge/discharge time coefficient $\alpha i$ (i=1, 2, 3, . . . , n). For example, as the timing belonging to the charge/discharge time ratio Ti is closer to the present time, the charge/discharge time coefficient $\alpha i$ may have a greater value, that is, to establish $\alpha 1 < \alpha 2 < \ldots < \alpha 4$ in the example of FIG. 7.

Equation 7

$$Rt = \frac{\Sigma \alpha i Ti}{\text{Tall}} \ (i = 1, 2, 3, \ldots, n) \quad (7)$$

The reversibly increasing resistance control unit 22D computes the target temperature, battery output reduction ratio, pause command value, and pump power reduction ratio based upon the charge/discharge time ratio Rt that the charge/discharge history computing unit 22C has computed, and outputs the computed target temperature to the battery temperature regulator control unit 22E, and the computed battery output reduction ratio, pause command value, and pump power reduction ratio, to the output command unit 22F.

FIGS. 8A to 8D represent the relationships of the target temperature, the battery output reduction ratio, the pause command value, and the pump power reduction ratio, respectively, with respect to the charge/discharge time ratio Rt.

Figure 8A:
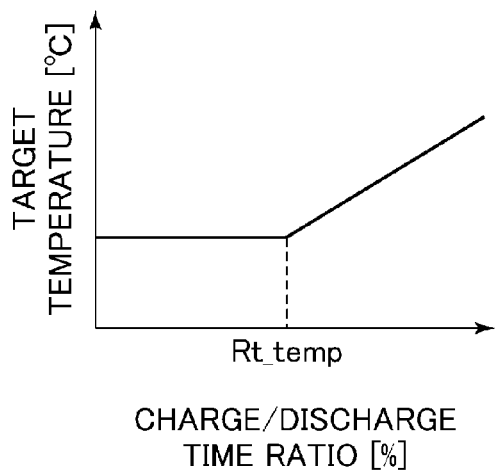
FIG. 8A is a diagram showing a relationship of a target temperature with respect to the charge/discharge time ratio in the first embodiment of the present invention.

The target temperature in FIG. 8A indicates that since the lithium ions in the battery electrolyte are distributed more slowly at lower temperatures of the lithium ions, the distribution of the lithium ions is more likely to be nonuniform, and the reversible increase in resistance is thus more prone to occur. Meanwhile, usual deterioration (the reversible increase in resistance) is caused by a factor such as formation of SEI (Solid Electrolyte Interface) as a covering on a negative side, and the formation of SEI means a tendency for higher temperatures to become more influential. As shown in FIG. 8A, therefore, the target temperature is set to be high for a high charge/discharge time ratio at which the reversible increase in resistance is considered to be more likely to occur. For a lower charge/discharge time ratio at which the reversible increase in resistance is considered to be less likely to occur, the target temperature is set to be low for suppressed usual deterioration.

If the charge/discharge time ratio Rt is equal to or higher than a threshold level Rt_temp, the hybrid control unit 22 assigns to the target temperature of the electricity storage device 16 a value at which the target temperature increases with an increase in charge/discharge time ratio Rt, and the hybrid control unit 22 functions as a unit to control the temperature regulator (16D, 16E) so that the temperature of the electricity storage device 16 equals the target temperature. The target temperature is a fixed value when Rt≤Rt_temp.

Figure 8B:
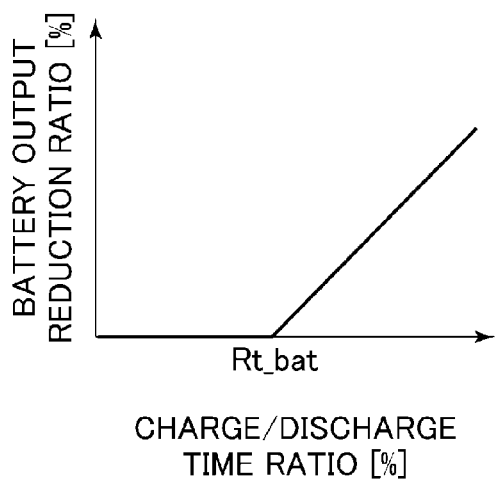
FIG. 8B is a diagram showing a relationship of a battery energy output reduction ratio with respect to the charge/discharge time ratio in the first embodiment of the present invention.

For the high charge/discharge time ratio at which the reversible increase in resistance is considered to be more likely to occur, the battery output reduction ratio in FIG. 8B is set to be high with priority assigned to the suppression of deterioration. For the low charge/discharge time ratio at which the reversible increase in resistance is considered to be less likely to occur, however, the battery output reduction ratio is set to be low with priority assigned to vehicle body operation.

If the charge/discharge time ratio Rt is equal to or higher than a threshold level Rt_bat, the hybrid control unit 22 here assigns to the output reduction ratio of the electricity storage device 16 a value at which the output reduction ratio increases with an increase in charge/discharge time ratio Rt, and in accordance with the output reduction ratio of the electricity storage device 16, assigns a command value for the electric power output from the inverter 15 (power converter). The hybrid control unit 22 further functions as a unit to control the inverter 15 so that the power output from the inverter 15 matches the command value. The output reduction ratio of the electricity storage device 16 is 0 when Rt≤Rt_bat.

Figure 8C:
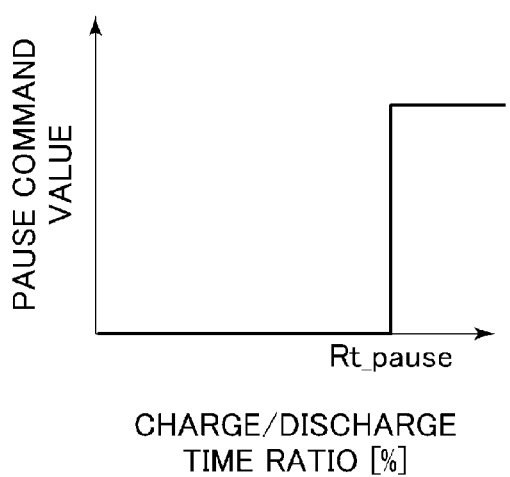
FIG. 8C is a diagram showing a relationship of a pause command value with respect to the charge/discharge time ratio in the first embodiment of the present invention.

For the high charge/discharge time ratio at which the reversible increase in resistance is considered to be more likely to occur, the pause command value in FIG. 8C is set to, for example, "1" to denote that a pause command is present, for reduced charge/discharge time ratio. For the low charge/discharge time ratio at which the reversible increase in resistance is considered to be less likely to occur, however, the pause command value is set to, for example, "0" to denote that the pause command is absent.

If the charge/discharge time ratio Rt is equal to or higher than a threshold level Rt_pause, the hybrid control unit 22 here functions as a unit to bring the inverter 15 into a pause (pause command value=1). The pause command value is 0 when Rt≤Rt_pause.

Figure 8D:
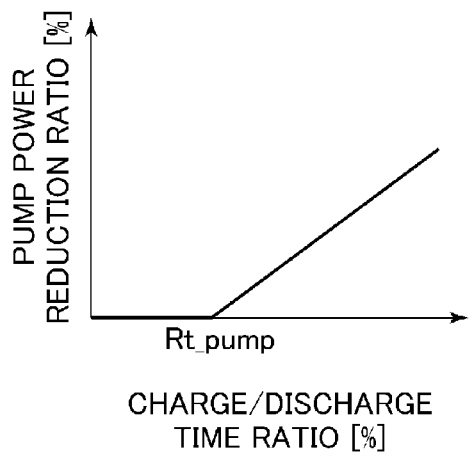
FIG. 8D is a diagram showing a relationship of a pump power reduction ratio with respect to the charge/discharge time ratio in the first embodiment of the present invention.

For the high charge/discharge time ratio at which the reversible increase in resistance is considered to be more likely to occur, the pump power reduction ratio in FIG. 8D is set to be high with priority assigned to the suppression of deterioration. For the low charge/discharge time ratio at which the reversible increase in resistance is considered to be less likely to occur, however, the pump power reduction ratio is set to be low with priority assigned to vehicle body operation.

If the charge/discharge time ratio Rt is equal to or higher, than a threshold level Rt_pump, the hybrid control unit 22 here assigns to the power reduction ratio of the hydraulic pump 17 (hydraulic pump unit) a value at which the power reduction ratio increases with an increase in charge/discharge time ratio Rt, and in accordance with the power reduction ratio of the hydraulic pump 17, assigns a command value for the power of the hydraulic pump 17. The hybrid control unit 22 further functions as a unit to control the pump capacity control unit 21 (hydraulic pump unit) so that the power of the hydraulic pump 17 matches the command value.

Here, the power reduction ratio is provided separately from the battery output reduction ratio because, in hybrid construction machines, since limiting the power of the electricity storage device 16 via the inverter 15 will limit high response, some conditions of the hydraulic working implement 4 and the engine 11 could lead to a sudden decrease in the operability.

While "Rt_temp=Rt_bat=Rt_pump<Rt_pause" may be set as an example in FIGS. 8A to 8D, Rt_temp, Rt_bat, and Rt_pump can have different values, in which case, Rt_temp, Rt_bat, and Rt_pump would or should be smaller than Rt_pause. Accordingly, 1 will be assigned to the pause command value as last method for controlling the reversible increase in resistance, and the inverter output power will be 0.

The battery temperature regulator control unit 22E computes the control command values for warming-up temperature regulator and cooling temperature regulator based upon the target temperature that the reversibly increasing resistance control unit 22D has computed, and outputs the computed control command values to the warming-up temperature regulator 16D and the cooling temperature regulator 16E.

Figure 9A:
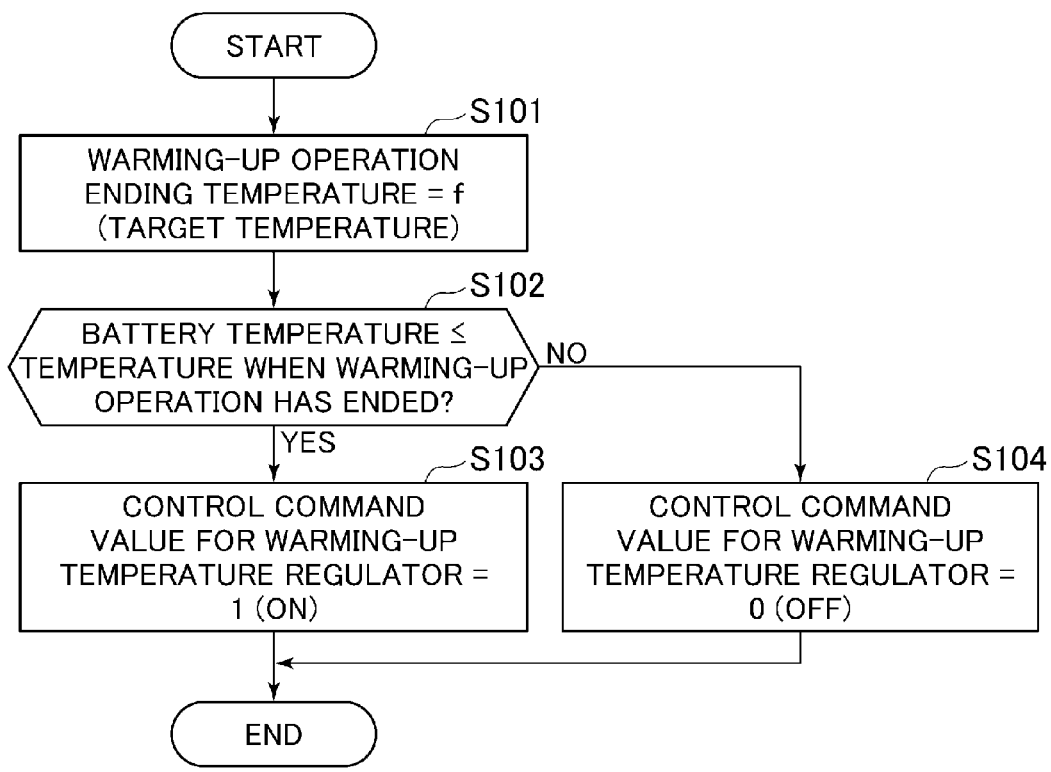
FIG. 9A is a control flowchart of a battery temperature regulator control unit relating to a warming-up battery temperature regulator control in the first embodiment of the present invention.

FIG. 9A is a control flowchart of the battery temperature regulator control unit 22E relating to the warming-up battery temperature regulator 16D. In step S101, the battery temperature regulator control unit 22E computes the temperature at which the warming-up operation is ended, or a warming-up operation end temperature, based upon the target temperature. This warming-up operation end temperature may be set to be lower than the target temperature by a fixed value, for example 5° C. below the target temperature, or may be set with reference to a table of warming-up operation end temperatures with respect to the target temperature. If in step S102 the battery temperature value that has been transmitted from the battery control unit 16C is determined to be equal to or lower than the warming-up operation end temperature, the battery temperature regulator control unit 22E assigns 1 (ON) as the control command value for warming-up temperature regulator in step S103. If in step S102 the battery temperature value that has been transmitted from the battery control unit 16C is determined to be in excess of the warming-up operation end temperature, the battery temperature regulator control unit 22E assigns 0 (OFF) as the control command value for warming-up temperature regulator in step S104.

If the temperature of the electricity storage device 16 is equal to or less than the warming-up operation end temperature, the hybrid control unit 22 here functions as a unit to control the warming-up battery temperature regulator 16D (temperature regulator) according to the charge/discharge history of the electricity storage device 16 so that the temperature of the electricity storage device 16 increases.

Figure 9B:
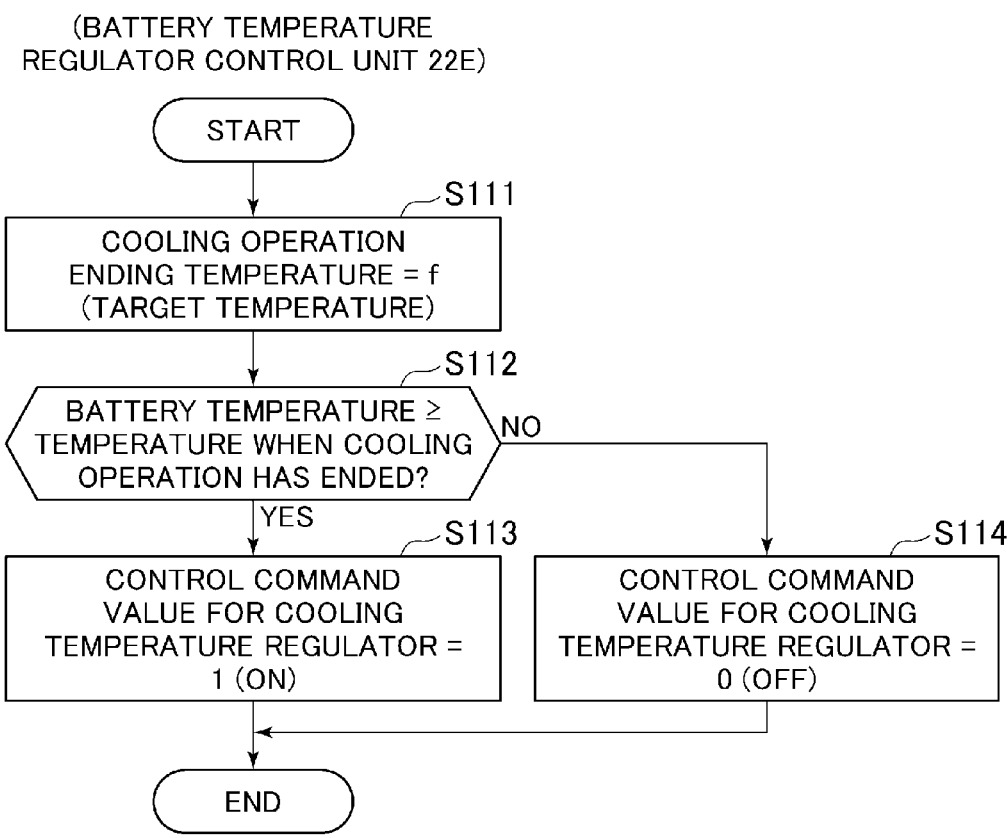
FIG. 9B is a control flowchart of a battery temperature regulator control unit relating to a cooling battery temperature regulator control in the first embodiment of the present invention.

FIG. 9B is a control flowchart of the battery temperature regulator control unit 22E relating to the cooling battery temperature regulator control 16E. In step S111, the battery temperature regulator control unit 22E computes a cooling operation end temperature based upon the target temperature. This cooling operation end temperature may be set to be higher than the target temperature by a fixed value, for example 5° C. above the target temperature, or may be set with reference to a table of independent cooling operation end temperatures with respect to the target temperature. If in step S112 the battery temperature value that has been transmitted from the battery control unit 16C is determined to be equal to or in excess of the cooling operation end temperature, the battery temperature regulator control unit 22E assigns 1 (ON) as the control command value for cooling temperature regulator in step S113. If in step S112 the battery temperature value that has been transmitted from the battery control unit 16C is determined to be less than the cooling operation end temperature, the battery temperature regulator control unit 22E assigns 0 (OFF) as the control command value for cooling temperature regulator in step S114.

If the temperature of the electricity storage device 16 is equal to or in excess of the cooling operation end temperature that is higher than the warming-up operation end temperature, the hybrid control unit 22 here functions as a unit to control the battery temperature regulator (16D, 16E) so that the temperature of the electricity storage device 16 decreases.

In accordance with the hydraulic pump power requirement, the engine output upper limit value, the allowable charge/discharge power, the battery output reduction ratio, the pause command, and the pump power reduction ratio, the output command unit 22F outputs a hydraulic pump power command, an engine output command, and an inverter power command, as control commands, to the pump capacity control unit 21, the engine control unit 12, and the inverter 15, respectively, to control these elements.

Figure 10:
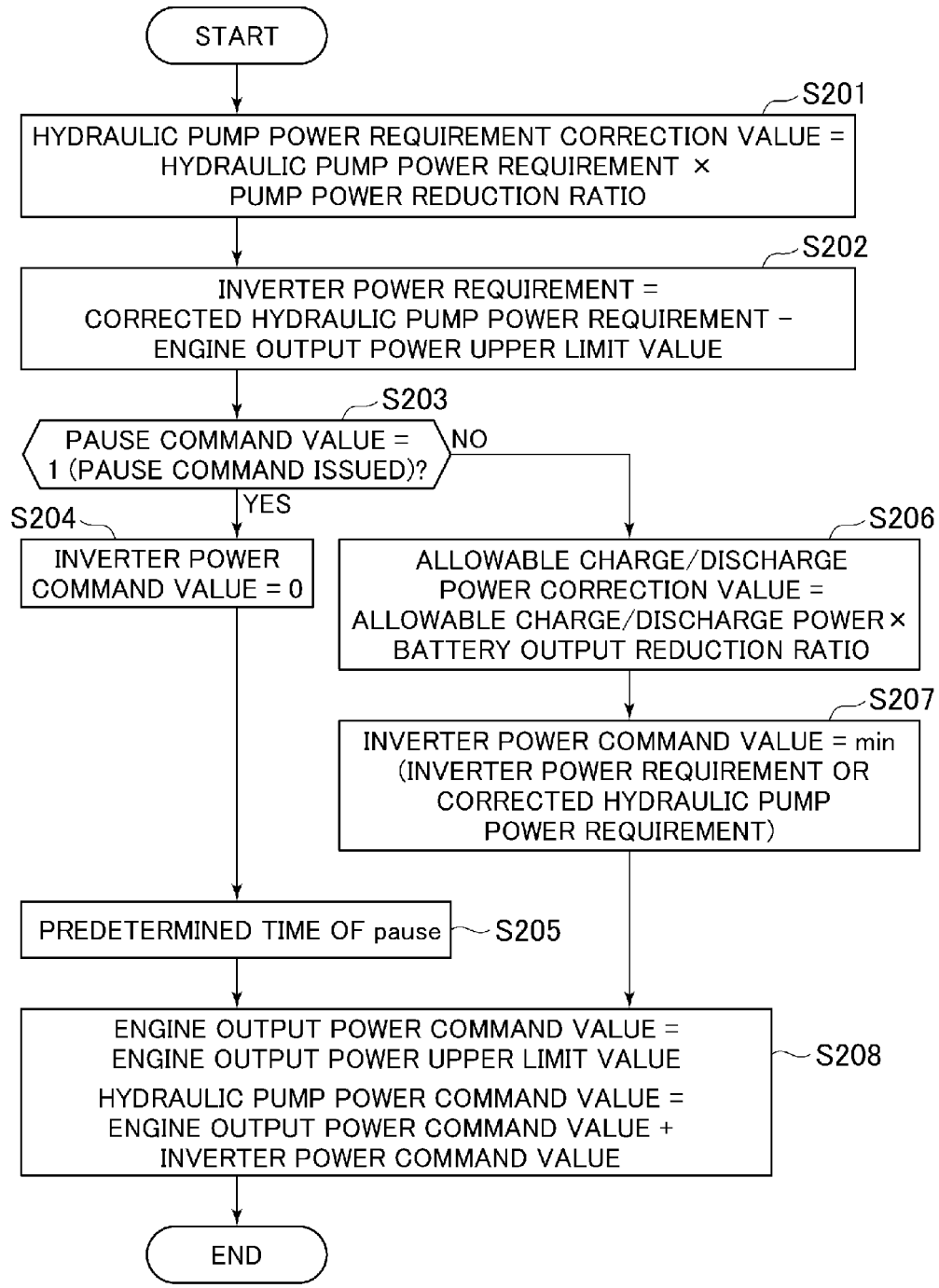
FIG. 10 is a flowchart that shows a control process flow relating to an output command unit in the first embodiment of the present invention.

Next, the control process for the output command unit 22F will be described in detail with reference to a flowchart of FIG. 10. In the computation of the control process, for ease of the description, the efficiency of hydraulic loads of the electric motor/generator 14, the inverter 15, the lithium ion battery 16A, the hydraulic pump 17, the hydraulic track motor 2A, and other elements is set to 100%, an ideal situation with no loss of power or delivery pressure.

First, the output command unit 22F computes a hydraulic pump power requirement correction value in step S201 by multiplying the pump power reduction ratio computed by the reversibly increasing resistance control unit 22D beforehand, by the hydraulic pump power requirement estimated by the hydraulic pump power estimating unit 22A. Next the output command unit 22F subtracts the engine output upper limit value computed by the engine output upper limit computing unit 22B, from a corrected hydraulic pump power requirement, and thereby computes the power required of the inverter 15 (hereinafter, this power will be conveniently referred to as the inverter power requirement) in step S202. The corrected hydraulic pump power requirement is a value obtained by subtracting the hydraulic pump power requirement correction value (in step S201) from the hydraulic pump power requirement.

Figure 11:
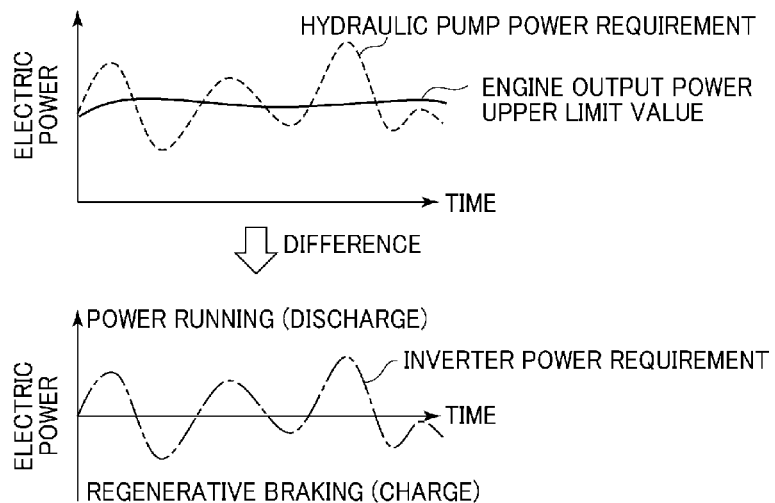
FIG. 11 is a diagram that shows time changes in the power required of a hydraulic pump in the first embodiment of the present invention, an upper limit value of engine output power, and electric power required of an inverter.

FIG. 11 represents the relationship between the hydraulic pump power requirement, the engine output upper limit value, and the inverter power requirement.

As shown in FIG. 11, as the hydraulic pump power requirement becomes greater than the engine output upper limit value, the inverter power requirement increases above 0 to become discharge power (electric motor/generator 14: power running), and as the hydraulic pump power requirement becomes smaller than the engine output upper limit value, the inverter power requirement decreases below 0 to become charge power (electric motor/generator 14: regenerative braking).

Referring back to FIG. 10, in step S203 the output command unit 22F determines presence/absence of the pause command, based upon the pause command value computed by the reversibly increasing resistance control unit 22D.

If in step S203 the pause command is determined to be present (pause command value=1), that is, if there is a response of YES in S203, the output command unit 22F regards the inverter power command value as 0 (in step S204) and retains this state for a predetermined time (for example, 60 minutes) in step S205.

If in step S203 the pause command is determined to be absent (pause command value=0), that is, if there is a response of NO in S203, the output command unit 22F computes the allowable charge/discharge power correction value in step S206 by multiplying the battery output reduction ratio computed by the reversibly increasing resistance control unit 22D, by the allowable charge/discharge power transmitted from the battery control unit 16C. The output command unit 22F next regards the inverter power command value as the inverter power requirement or corrected allowable charge/discharge power, whichever is the smaller, in step S207. The corrected allowable charge/discharge power is a value obtained by subtracting the allowable charge/discharge power correction value (in step S206) from the allowable charge/discharge power.

Finally, the output command unit 22F sets the engine output upper limit value as the engine output command value, and then in step S208, sets a sum of the engine output command value and the inverter power command value (in step S204 or S207) as the hydraulic pump power command value.

While in the first embodiment of the present invention the correction of the hydraulic pump power requirement in step S201 and the correction of the allowable charge/discharge power in step S206 are both performed, only one of the hydraulic pump power requirement correction in step S201 and the allowable charge/discharge power correction in step S206 may take place because, if the hydraulic pump power is corrected, the inverter power is limited as a result of automatic synchronization, and if the allowable charge/discharge power is corrected, the hydraulic pump power requirement is likewise limited as a result of automatic synchronization.

The output command unit 22F transmits the hydraulic pump power command corresponding to the hydraulic pump power command value (in step S208), the engine output command corresponding to the engine output power command value (in step S208), and the inverter command corresponding to the inverter power command value (in step S204 or S207), to the pump capacity control unit 21, the engine control unit 12, and the inverter 15, respectively, and ends the control process.

In the above way, the hybrid control unit 22 functions as the control unit that executes at least one of the first control for controlling the warming-up battery temperature regulator 16D (temperature regulator) so that it increases the temperature of the electricity storage device 16, the second control for controlling the inverter 15 so that it reduces the power output from the inverter 15 (power converter), and the third control for controlling the pump capacity control unit 21 (hydraulic pump unit) so that it reduces the flow rate of the fluid delivered from the hydraulic pump 17 (hydraulic pump unit), according to the charge/discharge history of the electricity storage device 16.

As described above, in the hybrid excavator 1 according to the first embodiment of the present invention, the battery temperature regulator control unit 22E and output command unit 22F of the hybrid control unit 22 control the operation of the hydraulic pump 17 and inverter 15 according to the target temperature, battery output reduction ratio, pause command value, and pump power reduction ratio that the reversibly increasing resistance control unit computed from the charge/discharge time ratio computed in advance by the charge/discharge history computing unit 22C. This control enables the prevention of the operability from significantly decreasing, while at the same time, reducing the occurrence of reversibly increasing resistance in the lithium ion battery 16A.

Second Embodiment

Figure 12:
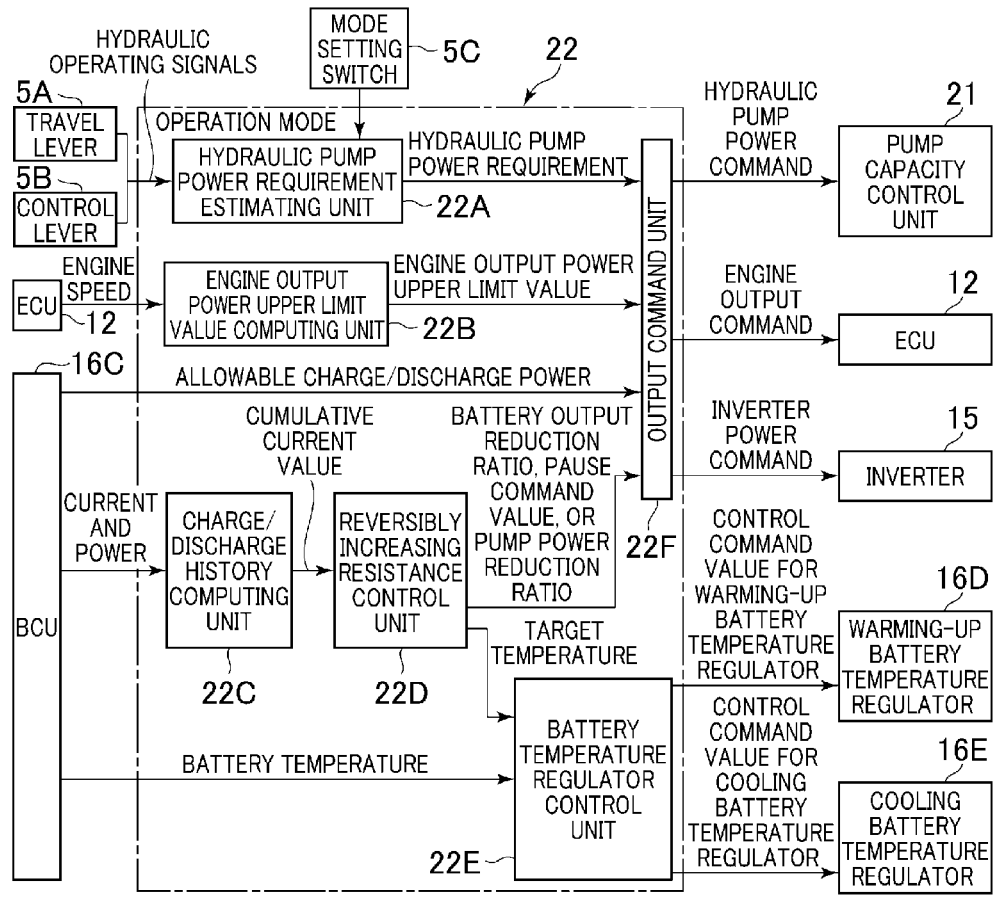
FIG. 12 is a functional block diagram showing a configuration of a hybrid control unit in a second embodiment of the present invention.

FIG. 12 is a functional block diagram showing a configuration of a hybrid control unit in a second embodiment of the present invention.

Figure 13:
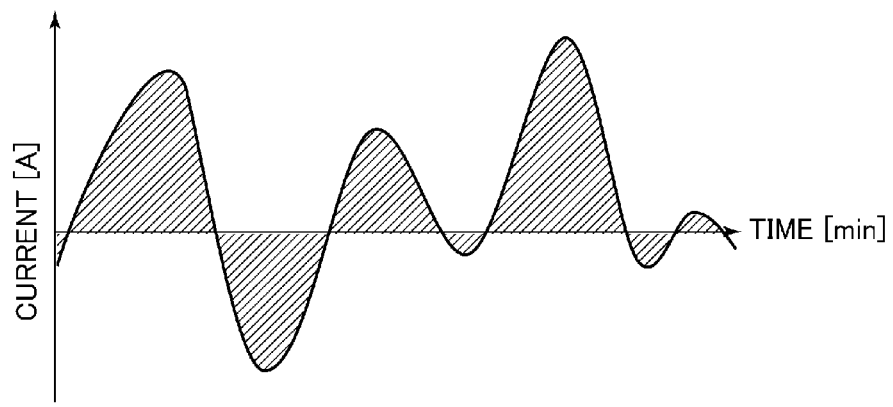
FIG. 13 is a diagram that shows changes in a cumulative current value of an electricity storage device in the second embodiment of the present invention.

The second embodiment of the present invention differs from the first embodiment of the invention in that whereas the charge/discharge history computing unit 22C inside the hybrid control unit 22 of the first embodiment outputs the charge/discharge time ratio Rt computed from the current or power of the electricity storage device 16, a charge/discharge history computing unit 22C of the second embodiment outputs, for example as shown in FIG. 13, cumulative current data on the electricity storage device 16 during a certain period of time, instead of the charge/discharge time ratio Rt.

Since a reversible increase in resistance is caused by a nonuniform distribution of lithium ions in the battery electrolyte, heavier loading causes the reversible increase in resistance more easily. In the second embodiment, impacts of the magnitude of the load can be allowed for by recognizing an output of the charge/discharge history computing unit 22C as a cumulative current value.

In addition, while the computation of the cumulative current value has been described here with a current value taken as an example, electric power or an absolute value of current or electric power or a square value thereof may instead be used as a computing index of the cumulative value.

Other constituent elements of the second embodiment are the same as those of the first embodiment, and overlapping description is omitted.

As described above, in the present embodiment, the occurrence of reversibly increasing resistance in the lithium ion battery 16A can be reduced while simultaneously preventing the operability from significantly decreasing.

Third Embodiment

Figure 14:
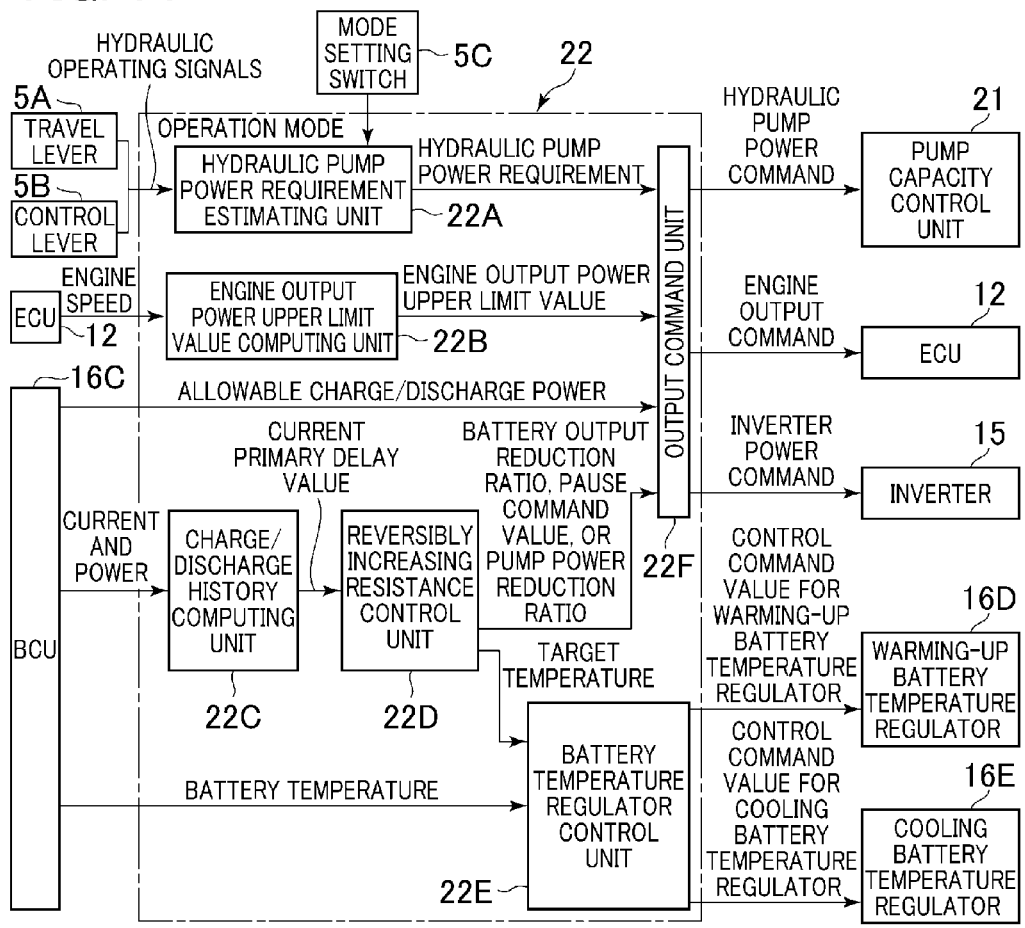
FIG. 14 is a functional block diagram showing a configuration of a hybrid control unit in a third embodiment of the present invention.

FIG. 14 is a functional block diagram showing a configuration of a hybrid control unit 22 in a third embodiment of the present invention.

A third embodiment of the present invention differs from the first embodiment of the invention in that whereas the charge/discharge history computing unit 22C inside the hybrid control unit 22 of the first embodiment outputs the charge/discharge time ratio Rt computed from the current or power of the electricity storage device 16, a charge/discharge history computing unit 22C of the third embodiment outputs, for example, a current primary delay value of the electricity storage device 16, instead of the charge/discharge time ratio Rt.

A control period $\Delta T$ of the hybrid control unit 22 and a time constant $\tau$ in computation of a primary delay are used for the computation of the current primary delay value "Ifol" from the following Equation (8).

Equation 8

$$I_{fol(i)} = \sqrt{(I_{(i)}^2 - I_{fol(i-1)}^2) + (\Delta T/\tau) + I_{fol(i-1)}^2} \quad (8)$$

In the second embodiment, impacts of the magnitude of a load can be allowed for by recognizing an output of the charge/discharge history computing unit 22C as a cumulative current value. To perform computations while incorporating any necessary updates of the cumulative current value during the certain period of time, however, current values in each control time within the reference time needs memory storage, which leads to an increase in memory capacity and hence an increase in cost. The hybrid control unit 22 according to the third embodiment, however, can be implemented with a minimum memory capacity since a previous value of a current primary delay is all that is required.

In addition, while the computation of the current primary delay value has been described herein with the square value of the current taken as an example, electric power or an absolute value of current or electric power or a square value thereof may instead be used as a computing index of the primary delay value.

Other constituent elements of the third embodiment are the same as those of the first embodiment, and overlapping description is omitted.

The hybrid control unit 22 here functions as a control unit to calculate an output value of feedback control, based upon a current value or power value of a charge/discharge current, and execute at least one of the first to third control in accordance with the output value of the feedback control.

As described above, in the present embodiment, the occurrence of reversibly increasing resistance in the lithium ion battery 16A can be reduced while simultaneously preventing the operability from significantly decreasing.

The embodiments that have been described above are detailed for a better understanding of the present invention, and each of the embodiments is not always limited to those including all the described elements. In addition, part of the configuration of an embodiment may be replaced with the configuration of another embodiment, and the configuration of an embodiment may be added to that of another embodiment.

In the first to third embodiments of the present invention, the hybrid control unit 22 changes the target temperature of the electricity storage device 16, the battery output reduction ratio, the pause command value, and the pump power reduction ratio, according to the charge/discharge time ratio Rt. At least one of these parameters however only needs to be changed.

In addition, the configuration where the electricity storage device 16 uses the lithium ion battery 16A has been described in each of the first to third embodiments of the present invention. The invention however is not limited to such a configuration and can likewise be applied to other electricity storage elements in which a reversible increase in resistance occurs in nickel hydrogen batteries or during heavy loading. The invention can be applied by appropriately setting the formats of the target temperature, battery output reduction ratio, pause command value, and pump power reduction ratio based upon a charge/discharge history of current and power, the formats conforming with the characteristics of the electricity storage device under the reversibly increasing resistance imposed during heavy loading.

Furthermore, while the case in which the hybrid construction machine according to each of the embodiments includes the hybrid excavator 1 has been described, the present invention is not limited to this case and the construction machine may be, for example, that of a hybrid wheel-loader type or hybrid dump truck type (including a plug-in hybrid construction machine), or may be a battery-operated one free of the engine 11 and driven only by output power of the electricity storage device 16.

The invention claimed is:

1. A hybrid construction machine comprising:
an engine;
an electric motor/generator that assists power of the engine during power running and generates electricity during regenerative braking;
a hydraulic pump unit that is driven by the power of the engine and delivers a hydraulic fluid;
an electricity storage device;
a power converter that converts direct-current power that has been received from the electricity storage device during the power running into alternating-current power and supply the alternating-current power to the electric motor/generator, the power converter converting the alternating-current power that the electric motor/generator has generated into direct-current power and supplying the direct-current power to the electricity storage device;
a temperature regulator that regulates a temperature of the electricity storage device; and
a control unit that executes at least one of a first control, a second control, and a third control in accordance with a charge/discharge history of the electricity storage device, the first control controlling the temperature regulator so that the temperature of the electricity storage device increases, the second control controlling the power converter so that the power that is output from the power converter is reduced, the third control controlling the hydraulic pump unit so that a flow rate of the fluid delivered from the hydraulic pump unit is reduced,
wherein the charge/discharge history is data on charge/discharge current of the electricity storage device, the data being measured during a certain period of time in a past,
wherein the data includes an electrical current value of the charge/discharge current, and
wherein the control unit is configured to:
calculate a charge/discharge time ratio denoting a rate of, with respect to the certain period of time, a sum of a period of time during which the current value of the charge/discharge current is equal to or greater than a first threshold level Ld, and a period of time during which the current value of the charge/discharge current is equal to or smaller than a second threshold level Lc that is smaller than the first threshold level Ld, and
execute at least one of the first control, the second control, and the third control in accordance with the charge/discharge time ratio.

2. The hybrid construction machine according to claim 1, wherein
the control unit assigns a greater weight to a current value measured more recently among current values measured in;
the period during which the current value of the charge/discharge current is equal to or greater than the first threshold level Ld, and
the period during which the current value of the charge/discharge current is equal to or smaller than the second threshold level Lc.

3. The hybrid construction machine according to claim 1, wherein
if the charge/discharge time ratio is equal to or higher than a third threshold level Rt_temp, the control unit executes the first control by;
assigning to a target temperature of the electricity storage device a value at which the target temperature increases with an increase in charge/discharge time ratio, and
controlling the temperature regulator so that the temperature of the electricity storage device equals the target temperature.

4. The hybrid construction machine according to claim 1, wherein
if the charge/discharge time ratio is equal to or higher than a fourth threshold level Rt_bat, the control unit executes the second control by:
assigning to an output reduction ratio of the electricity storage device a value at which the output reduction ratio increases with an increase in charge/discharge time ratio,
assigning a command value for the electric power output from the power converter in accordance with the output reduction ratio of the electricity storage device, and
controlling the power converter so that the power output from the power converter matches the command value.

5. The hybrid construction machine according to claim 1, wherein
if the charge/discharge time ratio is equal to or higher than a fifth threshold level Rt_pause, the control unit executes the second control by bringing the power converter into a pause.

6. The hybrid construction machine according to claim 1, wherein
if the charge/discharge time ratio is equal to or higher than a sixth threshold level Rt_pump, the control unit executes the third control by;
assigning to a power reduction ratio of the hydraulic pump unit a value at which the power reduction ratio increases with an increase in charge/discharge time ratio,
assigning a command value for the electric power output from the power converter in accordance with the power reduction ratio of the hydraulic pump unit, and
controlling the power converter so that the power output from the power converter matches the command value.

7. The hybrid construction machine according to claim 1, wherein the control unit executes the first control if the temperature of the electricity storage device is equal to or lower than a first temperature.

8. The hybrid construction machine according to claim 1, wherein
the control unit executes only the first control among the first control, the second control, and the third control.

9. A hybrid construction machine comprising:
an engine;
an electric motor/generator that assists power of the engine during power running and generates electricity during regenerative braking;
a hydraulic pump unit that is driven by the power of the engine and delivers a hydraulic fluid;
an electricity storage device;
a power converter that converts direct-current power that has been received from the electricity storage device during the power running into alternating-current power and supply the alternating-current power to the electric motor/generator, the power converter converting the alternating-current power that the electric motor/generator has generated into direct-current power and supplying the direct-current power to the electricity storage device;
a temperature regulator that regulates a temperature of the electricity storage device; and a control unit that executes at least one of a first control, a second control, and a third control in accordance with a charge/discharge history of the electricity storage device, the first control controlling the temperature regulator so that the temperature of the electricity storage device increases, the second control controlling the power converter so that the power that is output from the power converter is reduced, the third control controlling the hydraulic pump unit so that a flow rate of the fluid delivered from the hydraulic pump unit is reduced, wherein the control unit executes the first control if the temperature of the electricity storage device is equal to or lower than a first temperature, and wherein if the temperature of the electricity storage device is equal to or higher than a second temperature that is higher than the first temperature, the control unit executes a fourth control to control the temperature regulator so that the temperature of the electricity storage device decreases.

10. The hybrid construction machine according to claim 9, wherein the charge/discharge history is data on charge/discharge current of the electricity storage device, the data being measured during a certain period of time in a past.

11. The hybrid construction machine according to claim 10, wherein the data includes an electrical current value of the charge/discharge current, and wherein the control unit is configured to:

calculate a charge/discharge time ratio denoting a rate of, with respect to the certain period of time, a sum of a period of time during which the current value of the charge/discharge current is equal to or greater than a first threshold level Ld, and a period of time during which the current value of the charge/discharge current is equal to or smaller than a second threshold level Lc that is smaller than the first threshold level Ld, and execute at least one of the first control, the second control, and the third control in accordance with the charge/discharge time ratio.

12. The hybrid construction machine according to claim 9, wherein the control unit executes only the first control among the first control, the second control, and the third control.

* * * * *